(12) United States Patent
Yu

(10) Patent No.: US 6,730,598 B1
(45) Date of Patent: May 4, 2004

(54) INTEGRATION OF ANNEALING CAPABILITY INTO METAL DEPOSITION OR CMP TOOL

(75) Inventor: Jick M. Yu, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/475,729

(22) Filed: Dec. 30, 1999

(51) Int. Cl.[7] .......................... H01L 21/44; B05D 5/12; C23C 16/00
(52) U.S. Cl. ........................ 438/680; 438/681; 438/685; 438/686; 438/687; 427/8; 427/99; 427/248.1
(58) Field of Search ................................ 438/686, 680, 438/681, 685, 687; 427/8, 248.1, 99; 118/666; 204/192.37

(56) References Cited

U.S. PATENT DOCUMENTS

| | | | | |
|---|---|---|---|---|
| 5,882,498 A | * | 3/1999 | Dubin et al. | 205/261 |
| 5,943,600 A | * | 8/1999 | Ngan et al. | 438/653 |
| 5,968,587 A | * | 10/1999 | Frankel | 427/8 |
| 5,989,999 A | * | 11/1999 | Levine et al. | 438/267 |
| 6,017,820 A | * | 1/2000 | Ting et al. | 438/689 |

\* cited by examiner

*Primary Examiner*—Long Pham
*Assistant Examiner*—Shrinivas H Rao
(74) *Attorney, Agent, or Firm*—Blakely, Sokoloff, Taylor & Zafman LLP

(57) ABSTRACT

Integration of annealing capability into a metal deposition tool or a chemical mechanical polishing (CMP) tool. A wafer processing apparatus includes a metal deposition tool having annealing capability. The metal deposition tool can be an electroplating tool or a chemical vapor deposition tool or other metal deposition tool that deposits metal films, such as copper, onto silicon substrates for integrated circuit manufacturing. An annealing chamber is integrated into the metal deposition tool so that annealing of the metal film can be controlled such that the copper is consistently stabilized in preparation for a chemical mechanical polishing process. Alternatively, an annealing chamber can be integrated into a CMP tool.

35 Claims, 3 Drawing Sheets

INTEGRATION OF ANNEALING CAPABILITY INTO METAL DEPOSITION OR CMP TOOL

FIELD OF THE INVENTION

The present invention relates generally to semiconductor manufacturing and, in particular, to the integration of annealing capability into metal deposition tools or chemical mechanical polishing tools.

BACKGROUND OF THE INVENTION

In integrated circuit manufacturing processes, it is generally desirable to minimize the total number of steps in the process and the time between each step. While it is generally desirable to allow the greatest latitude in fabrication process parameters, in certain cases, known variations can be eliminated or controlled to an extent that provides a greater predictability of results of the process. One such variation occurs during the stabilization of metal films that are deposited on a wafer dielectric layer to form interconnects between active devices.

Integrated circuits (ICs) manufactured today generally include an elaborate system of metalized interconnects to couple the various devices that have been fabricated in the semiconductor substrate. The technology for forming these metalized interconnects is extremely sophisticated. Commonly, aluminum, copper or some other metal is deposited on a dielectric layer and then patterned to form interconnect paths. Another dielectric or insulation layer such as silicon dioxide ($SiO_2$) is then deposited over this first metal layer (metal 1); via openings are etched through the dielectric layer; and the second metal layer (metal 2) is deposited. The metal 2 layer covers the dielectric layer and fills the via openings, making electrical contact down to the metal 1 layer. After a metal layer is deposited, the layer is usually planarized in a chemical mechanical polishing (CMP) process to remove the portions of the metal layer that do not form the desired interconnects such as lines or vias.

A considerable amount of effort in the manufacturing of modern complex, high density, multilevel interconnections is devoted to the planarization of the individual layers of the interconnection structure. Nonplanar surfaces create poor optical resolution of subsequent photolithographic processing steps. Poor optical resolution prohibits the printing of high density lines. Another problem with nonplanar surface topography is the step coverage of subsequent metalization layers. If a step height is too large there is a serious danger that open circuits will be created. Planar interconnect surface layers are a must in the fabrication of modern high density multilevel integrated circuits.

CMP employs polishing to remove protruding steps formed along the upper surface of the inter-layer dielectric. CMP is also used to "etch back" deposited metal layers to form planar plugs or vias. In a typical CMP process, a silicon substrate or wafer is placed face down on a rotating table or platform covered with a flat polishing pad that has been coated with an active slurry. A carrier, which is typically made of a thick, nonflexible metal plate, is used to apply a downward force against the backside of the substrate. The downward force and the rotational movement of the pad together with the slurry facilitate the abrasive polishing and planar removing of the upper surface of the thin metal film.

Nonuniform polishing can result in too much film being removed from some parts of the wafer and not enough film being removed from other parts. Also, lack of uniformity in the polishing rate from wafer to wafer can result in decreased process yield and reliability. Significant effort has been expended in attempts to control the polishing part of the process of integrated circuit manufacturing.

Electroplating is becoming the favored technique at least for copper deposition in the semiconductor industry. Electroplated copper, however, is known to be unstable at room temperature. Its physical properties such as resistivity and hardness continue to change with time. This process can last for weeks and can have significant impact on the stability of the subsequent process steps such as CMP. Annealing can accelerate the stabilization of the copper film, but adds an additional step in the process flow. Also, when annealing is performed by a separate annealing tool, the time between the deposition of the copper or metal layer can vary due to any number of reasons, such as unavailability of the annealing tools, imprecise scheduling or a physical distance between the annealing tool and the CMP tool.

Changes in the resistivity and hardness of the metal that has been deposited can affect the rate of polishing during the CMP portion of the process. It is desirable to minimize the variability of the stabilization of the metal. Annealing helps to stop the degradation or change in the properties of the metal. If the deposited metal is stabilized consistently, greater predictability can be achieved in the CMP process.

SUMMARY OF THE INVENTION

In one embodiment, an apparatus includes a metal deposition tool having annealing capability.

BRIEF DESCRIPTION OF THE DRAWINGS

The present invention is illustrated by way of example, and not limitation, in the figures of the accompanying drawings in which.

DETAILED DESCRIPTION

A wafer processing apparatus including a metal deposition tool having annealing capability is described. Examples of metal deposition tools are electroplating tools or chemical vapor deposition (CVD) tools. The integration of annealing capability into a metal deposition tool can result in better control over the stabilization of the metal prior to a subsequent process such as chemical mechanical polishing (CMP). Alternatively, annealing capability can be integrated into the CMP tool.

Figure 1:
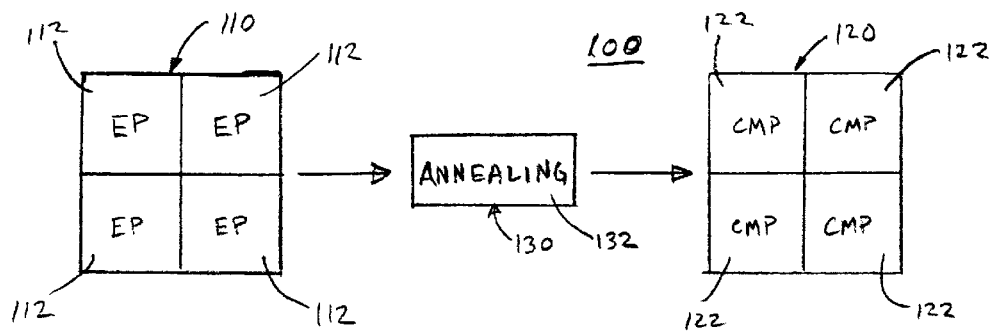
FIG. 1 is a schematic representation of a prior art wafer processing apparatus.

FIG. 1 is a schematic representation of a wafer processing apparatus 100 of the prior art. Electroplating tool 110 includes at least one, and usually a plurality, of electroplating chambers 112. A wafer is processed through wafer processing apparatus 100 by first having a metal such as copper deposited onto a dielectric layer of the silicon substrate in one of the electroplating chambers 112.

Typically, a batch or a plurality of wafers is processed in the electroplating tool 110 at the same time.

After electroplating, the wafer is moved to an annealing tool 130 that includes an annealing chamber 132. Annealing chambers can typically be a furnace that heats the wafer including the metal deposited on it by the electroplating process. The annealing process is performed in order to stabilize the electroplated or otherwise deposited metal. The annealing is typically done in preparation for the CMP process during which a portion of the metal is polished away. If the metal film is not stable, however, the polishing rate of the CMP process can be unpredictable. For example, because the hardness of the metal film can vary from wafer to wafer, it can be very difficult to determine how much polishing is adequate.

After the annealing process, the wafer is transferred to a CMP tool 120. As shown in FIG. 1, CMP tool 120 can include a plurality of CMP platforms 122. CMP platforms are typically rotating tables that include a rotating pad on which the wafer rests during polishing.

Currently, copper is becoming a preferred metal for use in electroplating interconnects on silicon wafers. Other metals such as gold or silver can also be deposited by electroplating. In the past, the electroplating of copper was used mostly for decorative purposes. As such, the stability of the copper film was not a concern.

The resistivity of the copper film can be measured in an attempt to determine whether and to what extent the microstructure of the copper film has changed. Measuring the resistivity can indicate whether the microstructure, for example the grain size or crystal orientation, of the copper has changed. Directly measuring grain size or crystal orientation requires destructive tests that are not easily performed in a manufacturing setting.

It is desirable to make the wafer manufacturing process more efficient by eliminating any potential causes of change. For instance, since electroplated copper is unstable at room temperature, its properties tend to change over time. The change in the properties such as hardness or resistivity increases the variability of the polishing rate during CMP because the copper film is not at the same level of hardness, for example, every time for every wafer when polishing begins. It is desirable to stabilize the film by annealing before CMP. If the annealing is not performed shortly after the copper has been deposited by either electroplating or chemical vapor deposition (CVD), however, there is unpredictability in the properties of the copper film because of the lapse of time between the metal deposition process and annealing. During the time that has elapsed between these two steps, the copper film tends to change. If the annealing is not performed consistently, it is difficult to predict the rate of polishing that is necessary to achieve the desired results.

During electroplating, the wafer is placed into a solution containing sulfuric acid and other additives that may include metal particles such as copper. The electroplating tank has a cathode and an anode dipped into the solution. The anode can be made of copper. During the electroplating process, metal particles within the solution (or from the anode as it dissolves) are deposited on the surface of a dielectric layer of the silicon substrate. The copper particles fill small features such as holes, lines or trenches that have been formed in the dielectric layers on the substrate. After the copper is deposited, CMP is performed to remove the copper that is not needed down to a pre-selected plane leaving interconnects between different devices on the substrate.

When copper film is deposited by electroplating or CVD, there can be outgassing for a period of time. Annealing can stabilize outgassing. During the annealing process, the metal deposited by electroplating or CVD is heated to temperatures of 50 to 400 degrees Celsius. Typically, about 200 degrees Celsius is the temperature at which annealing is performed. The time for annealing can vary from about 1 to about 60 minutes depending on the temperature used. Typically, the higher the temperature, the shorter the time necessary to achieve stabilization of the metal by annealing.

Figure 2:
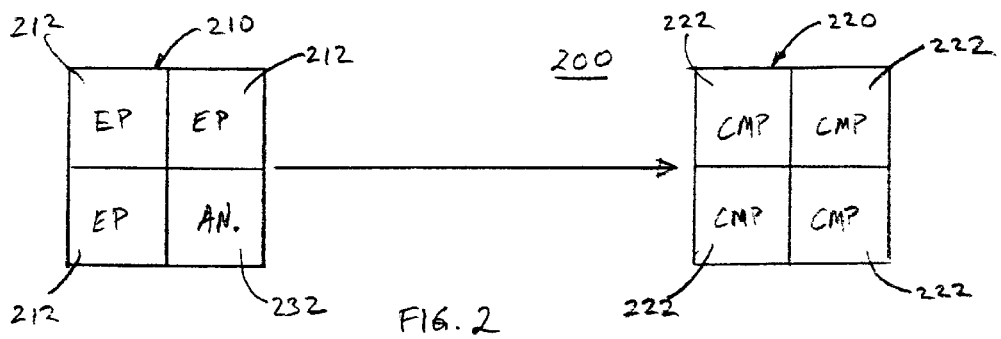
FIG. 2 is a schematic representation of an embodiment of a wafer processing apparatus.

FIG. 2 shows one embodiment in which a wafer processing apparatus 200 includes a metal deposition tool and a CMP tool. The metal deposition tool shown in FIG. 2 is an electroplating tool 210 that has multiple electroplating chambers 212. FIG. 2 shows a schematic representation of an annealing chamber 232 on the electroplating tool 210.

Annealing chamber 232 can be attached to or added onto electroplating tool 210. Alternatively, electroplating tool 210 can be modified such that one of its plurality of electroplating chambers 212 is replaced by annealing chamber 232. More than one annealing chamber 232 can also be provided. Annealing chamber 232 can be a furnace (not shown) or can include heat lamps (not shown) or a hot stage (not shown).

CMP tool 220 is shown in FIG. 2 as having multiple CMP platforms 222. Alternatively, multiple CMP tools 220 can be provided for apparatus 200 or a single CMP tool 220 can provide a single CMP platform 222.

Figure 3:
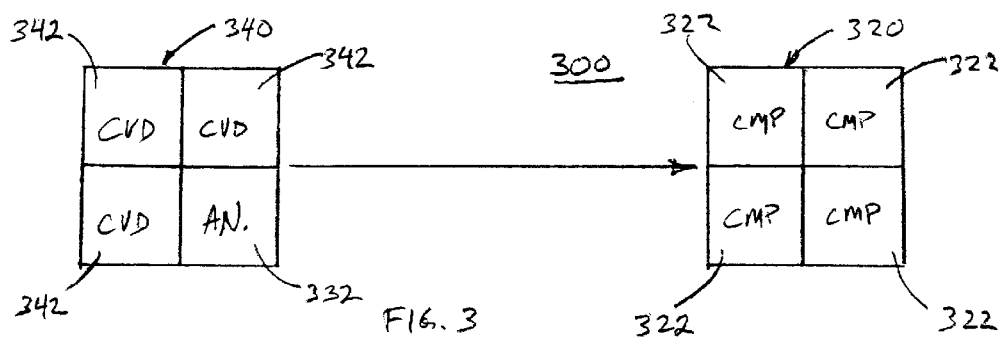
FIG. 3 is another embodiment of a wafer processing apparatus.

FIG. 3 shows another embodiment in which a wafer processing apparatus includes a metal deposition tool that is a chemical vapor deposition (CVD) tool 340. Also, apparatus 300 includes a CMP tool 320.

CVD tool 340 includes multiple CVD chambers 342. Annealing chamber 332 is provided on CVD tool 340. Annealing chamber 332 can be attached to or can replace a CVD chamber 342 of CVD tool 340. A wafer being processed will have a metal such as copper deposited by CVD in one of the CVD chambers 342. After the metal deposition process, the wafer is moved to annealing chamber 332, which is provided on CVD tool 340. Because annealing chamber 332 is integrated into CVD tool 340, the annealing process can begin almost immediately to avoid the degradation of the deposited metal. After the wafer has undergone annealing in the annealing chamber 332, it is transferred to the CMP tool 320 and onto one of the CMP platforms 322.

Figure 4:
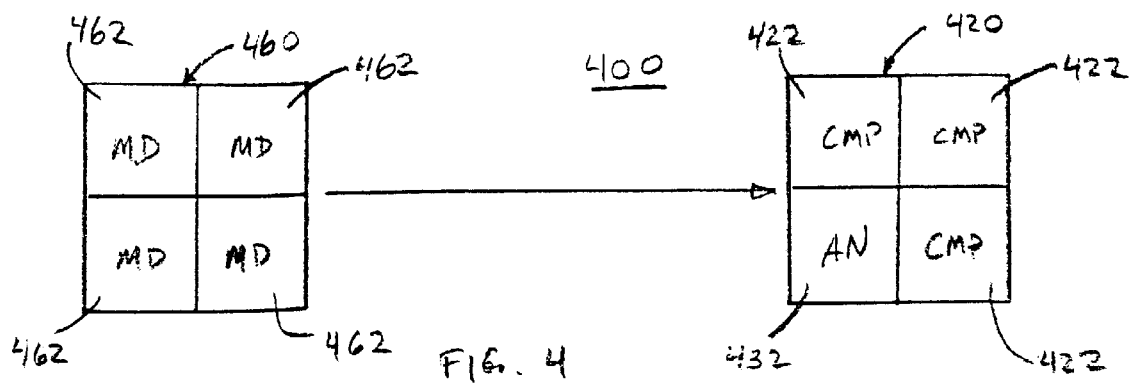
FIG. 4 is yet another embodiment of a wafer processing apparatus.

FIG. 4 shows yet another embodiment in which a wafer processing apparatus 400 includes a metal deposition tool 460 and a CMP tool 420. In the embodiment shown in FIG. 4, metal deposition tool 460 includes metal deposition chambers 462. Metal deposition tool 460 can be an electroplating tool or a CVD tool, for example. Also, a metal deposition tool need not have multiple metal deposition chambers 462. Annealing chamber 432 is integrated into the CMP tool 420 in the embodiment illustrated in FIG. 4. CMP tool 420 includes CMP platforms 422. During processing, the wafer is transferred from metal deposition tool 460 into annealing chamber 432, which is on CMP tool 420 in this embodiment. After annealing in annealing chamber 432, the wafer is transferred almost immediately to a CMP platform 422 to undergo the CMP process. In this case, the amount of time between the end of the annealing process and the beginning of the CMP process can be controlled.

Alternatively, annealing can be performed after CMP to influence the final properties of the metal. The apparatus 400 of FIG. 4 can also provide this capability. Annealing before CMP can influence the microstructure of the metal layer quite differently than annealing after CMP because more metal is present before CMP. Annealing can cause the grain to grow differently due to the presence of more or less material.

Figure 5:
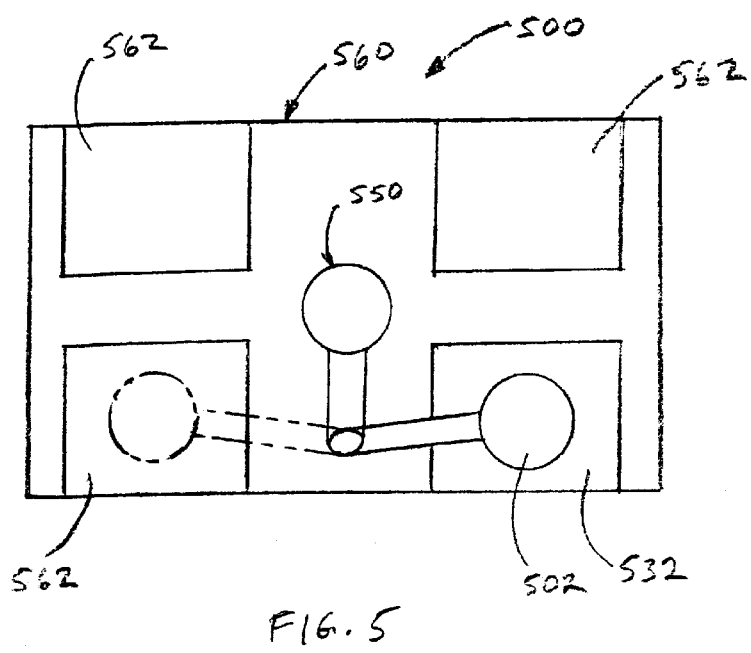
FIG. 5 is a top plan view of one embodiment of a wafer processing apparatus.

FIG. 5 shows an embodiment in which a wafer processing apparatus 500 includes a metal deposition tool 560 and a robot 550 on the metal deposition tool 560. Metal deposition tool 560 includes a plurality of metal deposition chambers 562. As described above, metal deposition tool 560 can be an electroplating tool or a CVD tool, or any other type of tool that deposits metal onto the dielectric layer of a silicon substrate in the manufacture of integrated circuit devices.

Robot 550 moves a wafer 502 from a metal deposition chamber 562 to an annealing chamber 532. Annealing chamber 532 is shown on metal deposition tool 560. FIG. 5 illustrates an embodiment in which annealing chamber 532 can be provided as part of metal deposition tool 560 or metal deposition tool 560 can be modified such that annealing chamber 532 replaces a metal deposition chamber 562.

Alternatively, wafer processing apparatus 500 can include an annealing chamber that is on a CMP tool. In this case, robot 550 would move the wafer 502 from the annealing chamber 532 into a CMP chamber or vice versa. It is preferred that annealing be performed before CMP in order to stabilize the metal that was deposited onto the wafer, thus providing more predictability in the CMP process. Alternatively, annealing can be performed after CMP to influence the final properties of the metal.

Figure 6:
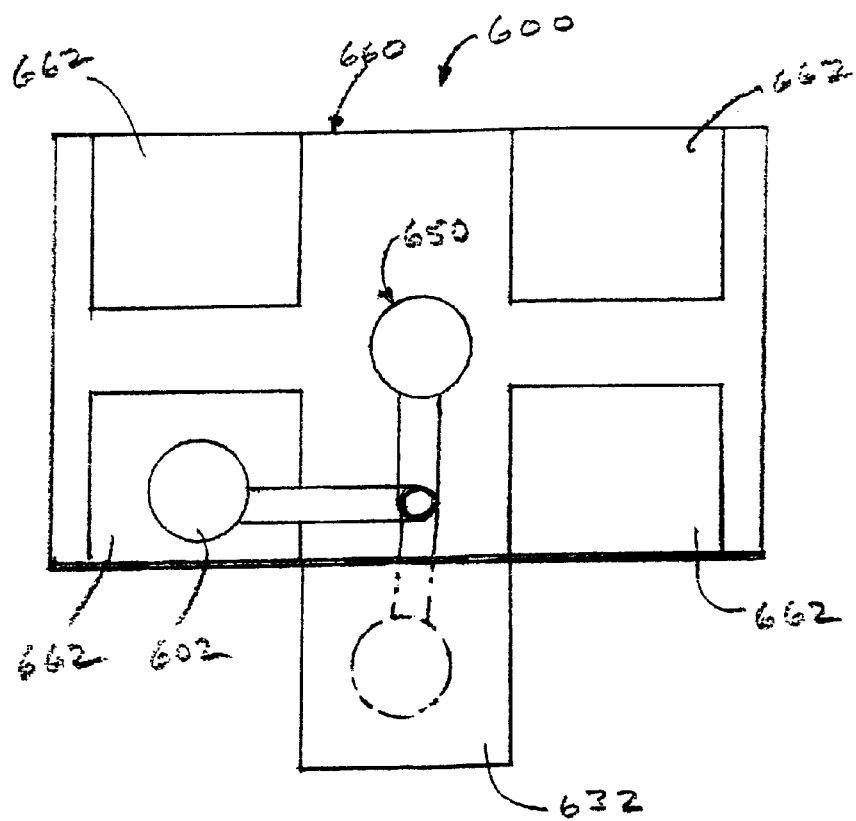
FIG. 6 is a top plan view of another embodiment of a wafer processing apparatus.

FIG. 6 shows an embodiment in which wafer processing apparatus 600 includes a metal deposition tool 660 (or, alternatively, a CMP tool) and an annealing chamber 632 attached to the side of metal deposition tool 660. In FIG. 6, metal deposition tool 660 includes a plurality of metal deposition chambers 662. Annealing chamber 632 can be provided adjacent to metal deposition tool 660 and its metal deposition chambers 662. Robot 650 is also provided to move wafer 602 between metal deposition chambers 662 and annealing chamber 632.

An embodiment of a wafer processing method includes depositing a metal onto a substrate such as a wafer in a metal deposition chamber of a metal deposition tool. The substrate is then moved from the metal deposition chamber directly to an annealing chamber. Preferably, the annealing chamber is part of the metal deposition tool. The annealing process includes heating the metal in the annealing chamber. The method can include a metal deposition tool that is an electroplating tool having at least one electroplating chamber. The method alternatively can include a metal deposition tool that is a chemical vapor deposition (CVD) tool having at least one CVD chamber. Preferably, the method includes annealing or heating the wafer including the deposited metal before chemical mechanical processing (CMP) of the substrate is performed.

Alternatively, a wafer processing method can include depositing a metal onto a substrate in a metal deposition chamber of a metal deposition tool, moving the substrate from the metal deposition tool to an annealing chamber that is part of a chemical mechanical polishing (CMP) tool, heating the metal in the annealing chamber, moving the substrate from the annealing chamber to a CMP platform on the CMP tool and polishing the substrate including the metal after annealing.

Yet another alternative embodiment of a wafer processing method can include depositing a metal onto a substrate in a metal deposition chamber of a metal deposition tool; moving the substrate from the metal deposition tool to a chemical mechanical polishing (CMP) platform on a CMP tool; polishing the substrate including the metal; moving the substrate from the CMP platform to an annealing chamber, wherein the annealing chamber is part of the CMP tool; and heating the metal in the annealing chamber. In this case, annealing can be performed after CMP.

Yet another alternative embodiment can include annealing before and after CMP. This embodiment can include an annealing chamber on both the metal deposition tool and on the CMP tool of a wafer processing apparatus.

What is claimed is:

1. A method comprising:
   depositing a metal film to fill an interconnect trench in a metal deposition chamber;
   robotically moving the metal film from the metal deposition chamber to a proximate annealing chamber;
   annealing the metal film in the annealing chamber; and
   removing a portion of the annealed metal film to form an interconnect.

2. An integrated circuit containing an interconnect formed by the method of claim 1.

3. A microprocessor comprising an interconnect formed by the method of claim 1.

4. The method of claim 1, wherein depositing comprises depositing a film containing a metal selected from the group consisting of aluminum, copper, gold, and silver.

5. The method of claim 4, wherein depositing comprises electroplating copper.

6. The method of claim 1, wherein annealing comprises annealing in an annealing chamber containing a device selected from the group consisting of a furnace a heat lamp, or a hot stage.

7. The method of claim 1, wherein annealing comprises heating for a time sufficient to stabilize a hardness of the metal film.

8. The method of claim 1, wherein annealing comprises heating at a temperature that is between 50 and 400 degrees Celsius for a time that is between 1 and 60 minutes.

9. The method of claim 1, wherein annealing comprises heating to a temperature of approximately 200 degrees Celsius.

10. The method of claim 1, wherein the annealing chamber replaces a previous second metal deposition chamber.

11. The method of claim 1:
    wherein depositing, robotically moving, and annealing comprise depositing, robotically moving, and annealing on a single integrated tool that comprises the metal deposition chamber, the annealing chamber, and a robot to move the metal film from the metal deposition chamber to the annealing chamber; and
    wherein removing comprises removing on a tool that is physically separated from the integrated tool.

12. An integrated circuit containing an interconnect formed by the method of claim 11.

13. A microprocessor comprising an interconnect formed by the method of claim 11.

14. A method comprising:
    depositing a metal layer containing a metal selected from the group consisting of copper, aluminum, gold, and silver on a wafer within an integrated tool;
    moving the wafer having the metal layer deposited thereon a short distance within the integrated tool;
    annealing the metal layer within the integrated tool; and
    removing a portion of the annealed metal layer to form an interconnect.

15. An integrated circuit containing an interconnect formed by the method of claim 14.

16. The method of claim 14:
    wherein depositing moving and annealing are performed within an integrated tool comprising a plurality of chambers that consist essentially of one or more metal deposition chambers and one or more annealing chambers.

17. A microprocessor comprising an interconnect formed by the method of claim 16.

18. A method comprising:
depositing a metal film to fill an interconnect trench formed within a wafer dielectric layer in a metal deposition chamber;
annealing the metal film in an annealing chamber;
robotically moving the annealed metal film from the annealing chamber to a proximate metal removal chamber; and
removing a portion of the annealed metal film to form an interconnect.

19. An integrated circuit comprising an interconnect formed by the method of claim 18.

20. The method of claim 18, wherein depositing comprises depositing a film containing a metal selected from the group consisting of aluminum, copper, gold, and silver.

21. The method of claim 18, wherein depositing comprises electroplating copper.

22. The method of claim 18, wherein annealing comprises annealing in an annealing chamber containing a device selected from the group consisting of a furnace, a heat lamp, or a hot stage.

23. The method of claim 18, wherein annealing comprises heating for a time sufficient to stabilize a hardness of the metal film.

24. The method of claim 18, wherein annealing comprises heating to a temperature of approximately 200 degrees Celsius.

25. The method of claim 18, wherein the annealing chamber replaces a previous second metal removal chamber.

26. The method of claim 18:
wherein depositing comprises depositing in a first tool; and
wherein annealing, robotically moving, and removing comprise annealing, robotically moving, and removing on a second integrated tool that comprises the annealing chamber, the removal, chamber, and a robot to move the metal film from the annealing chamber to the removal chamber.

27. An integrated circuit containing an interconnect formed by the method of claim 18.

28. The method of claim 1, wherein said depositing and said annealing are performed in an integrated wafer processing tool for a plurality of batches of wafers, such that times between deposition and annealing for each of the plurality of batches of wafers are substantially invariant.

29. The method of claim 1:
wherein depositing comprises depositing a metal film containing copper deposited by a deposition technique selected from the group consisting of electroplating and chemical vapor deposition;
wherein annealing comprises annealing to stabilize outgassing from the deposited metal film;
wherein depositing, robotically moving, and annealing are performed in a first integrated tool;
wherein removing comprises polishing the annealed metal film; and
wherein removing is performed in a second tool that is separated from the first integrated tool.

30. The method of claim 1, further comprising, prior to said depositing, modifying a tool containing the metal deposition chamber and a second metal deposition chamber so that the annealing chamber replaces the second metal deposition chamber.

31. The method of claim 1, wherein annealing comprises annealing in an annealing chamber containing a furnace.

32. The method of claim 14, wherein said depositing and said annealing are performed in an integrated tool for a plurality of batches of wafers, such that times between deposition and annealing for each of the plurality of batches of wafers are substantially invariant.

33. The method of claim 14:
wherein depositing comprises depositing a metal film containing copper deposited by a deposition technique selected from the group consisting of electroplating and chemical vapor deposition;
wherein annealing comprises annealing to stabilize outgassing from the deposited metal film;
wherein depositing, moving, and annealing are performed in a first integrated tool;
wherein removing comprises polishing the annealed metal film; and
wherein removing is performed in a second tool that is separated from the first integrated tool by a physical distance.

34. The method of claim 18, further comprising, prior to said depositing, modifying a second metal deposition chamber of a tool so that the annealing chamber replaces the second metal deposition chamber.

35. The method of claim 18, wherein annealing comprises annealing in a furnace.

* * * * *